United States Patent
Sakurai et al.

(10) Patent No.: US 6,194,492 B1
(45) Date of Patent: *Feb. 27, 2001

(54) ANISOTROPIC CONDUCTIVE FILM

(75) Inventors: Ryo Sakurai; Takahiro Matsuse; Hidefumi Kotsubo; Tetsuo Kitano; Yasuhiro Morimura, all of Kodaira (JP)

(73) Assignee: Bridgestone Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/090,931

(22) Filed: Jun. 5, 1998

(30) Foreign Application Priority Data

Jun. 6, 1997 (JP) .................................................. 9-165198

(51) Int. Cl.$^7$ ................................ C08K 3/08; B32B 5/16
(52) U.S. Cl. .......................... 523/515; 428/523; 428/344; 428/347; 428/355; 428/356; 264/22; 264/331.5; 252/511
(58) Field of Search ........................... 428/344, 347, 428/355, 356, 523; 264/22, 331.15; 252/511; 523/515

(56) References Cited

U.S. PATENT DOCUMENTS

| | | | |
|---|---|---|---|
| 4,731,282 | | 3/1988 | Tsukagoshi et al. . |
| 5,336,443 | * | 8/1994 | Odashima .............................. 252/511 |
| 5,685,939 | * | 11/1997 | Wolk et al. ........................... 156/277 |
| 5,932,339 | * | 8/1999 | Sakurai et al. ....................... 428/323 |

FOREIGN PATENT DOCUMENTS

98/06007    2/1998  (WO) .

OTHER PUBLICATIONS

Patent Abstract of Japan, vol. 097, No. 009, Sep. 30, 1997 (JP 09 118860 A).

* cited by examiner

Primary Examiner—James J. Seidleck
Assistant Examiner—Olga Asinovsky
(74) Attorney, Agent, or Firm—Sughrue, Mion, Zinn, Macpeak & Seas, PLLC

(57) ABSTRACT

Disclosed is an anisotropic conductive film which exhibits a conductivity in the thickness direction thereof by pressurizing the film in the thickness direction, the film including: an adhesive; and conductive particles dispersed in the adhesive; wherein the adhesive is a thermosetting or photosetting adhesive containing as a main component at least one kind selected from a group consisting of (a) a polymer obtained by acetalation of a polyvinyl alcohol, (b) a compound containing an allyl group, (c) a monomer containing an acryloxy group or methacryloxy group, and (d) a polymer obtained by polymerization of one or more selected from a group consisting of an acrylic monomer and a methacrylic monomer.

8 Claims, No Drawings

ANISOTROPIC CONDUCTIVE FILM

BACKGROUND OF THE INVENTION

The present invention relates to an anisotropic conductive film capable of exhibiting a conductivity only in the thickness direction thereof, which is used to be interposed between opposed circuits for connecting the circuits to each other through conductive particles contained in the film and also adhesively bonding them to each other by pressurizing and heating the film interposed therebetween.

An anisotropic conductive film is used to be formed between various terminals for adhesively bonding and also electrically connecting the terminals to each other. For example, it is used for connection of a FPC (Flexible Printed Circuit) and TAB (Taped Automated Bonding) to ITO terminals formed on a glass substrate of a liquid crystal panel.

In general, an anisotropic conductive film is characterized in that conductive particles are dispersed in an adhesive mainly containing an epoxy or phenol based resin and a hardener. As the adhesive, a one-component thermosetting type has been mainly used for the sake of convenience in use. Various attempts have been made to increase an adhesive strength of an anisotropic conductive film in order to obtain a stable reliability in connection even under a high temperature/high humidity environment.

The conventional anisotropic conductive film using an epoxy or phenol based resin, however, has a drawback in terms of low adhesive strength, poor workability and low heat/humidity resistance.

SUMMARY OF THE INVENTION

An object of the present invention is to provide an anisotropic conductive film capable of increasing the adhesive strength, improving the workability, and enhancing the humidity/heat resistance.

To achieve the above object, according to the present invention, there is provided an anisotropic conductive film which exhibits a conductivity in the thickness direction thereof by pressurizing the film in the thickness direction, the film including: an adhesive; and conductive particles dispersed in the adhesive; wherein the adhesive is a thermosetting or photosetting adhesive containing as a main component at least one kind selected from a group consisting of (a) a polymer obtained by acetalation of a polyvinyl alcohol, (b) a compound containing an allyl group, (c) a monomer containing an acryloxy group or methacryloxy group, and (d) a polymer obtained by polymerization of one or more selected from a group consisting of an acrylic monomer and a methacrylic monomer. The above adhesive is preferably added with at least one kind of monomer selected from a group consisting of an acryloxy group-containing compound, a methacryloxy group-containing compound, and an epoxy group-containing compound in an amount of 0.5 to 80 parts by weight on the basis of 100 parts by weight of the material.

The anisotropic conductive film of the present invention using a thermosetting or photosetting adhesive mainly containing the above material has the following features:

(1) The film is good in humidity/heat resistance, and also it is good in durability, that is, it effectively exhibits characteristics thereof even after being kept under a high humidity/high temperature environment for a long period of time.
(2) The film is good in repair characteristic.
(3) The film is good in transparency.
(4) The film stably exhibits a high adhesive strength as compared with the conventional one.
(5) The film is good in light transmissivity upon positioning of electrodes because it employs the above transparent polymer, thereby enhancing the workability.
(6) The conventional film using an epoxy or phenol based resin must be heated at a temperature of 150° C. or more. On the contrary, the film of the present invention allows adhesive bonding by curing at a temperature of 130° C. or less, specifically, 100° C. or less, and particularly, in the case of using the UV curing type film, such a film allows adhesive bonding by curing at a further reduced temperature.
(7) The conventional film using an epoxy or phenol based resin, which is poor in adhesive strength, is difficult to be temporarily fixed on electrodes with such a poor adhesive strength and thereby it tends to be peeled therefrom, resulting in the degraded workability. On the contrary, the film of the present invention, which is high in adhesive strength upon temporary fixture, is good in workability.

DETAILED DESCRIPTION OF THE INVENTION

An anisotropic conductive film of the present invention includes an adhesive and conductive particles dispersed in the adhesive, characterized in that the adhesive is a thermosetting or photosetting adhesive containing as a main component at least one kind selected from a group consisting of (a) a polymer obtained by acetalation of a polyvinyl alcohol, (b) a compound containing an allyl group, (c) a monomer containing an acryloxy group or methacryloxy group, and (d) a polymer obtained by polymerization of one or more selected from a group consisting of an acrylic monomer and a methacrylic monomer.

It should be noted that the wording "main component" in the present invention means that the adhesive contains the main component in an amount of 50% by weight or more on the basis of the total weight of all the components of the adhesive except for the conductive particles and a hydrocarbon resin to be described later.

The above polymer in the item (a) is a polymer obtained by acetalation of a polyvinyl alcohol having a melt flow rate (MFR), called also melt index which is in a range of 1 to 3000, preferably 1 to 1000, more preferably 1 to 800.

The polymer obtained by acetalation of a polyvinyl alcohol preferably contains 30 mol % or more of an acetal group. If the content of the acetal group is less than 30 mol %, the humidity resistance may be made poor. As the polymer (polyvinylacetal) obtained by acetalation of a polyvinyl alcohol, there may be used a polyvinyl formal or polyvinyl butyral. In particular, a polyvinyl butyral is preferably used.

As the compound containing an allyl group in the item (b), there may be used a monomer of triallyl cyanurate, triallyl isocyanurate, diallyl phthalate, diallyl isophthalate, or diallyl maleate; or a polymer obtained by polymerization of one or more of these monomers.

As the monomer containing an acryloxy group or a methacryloxy group in the item (c), there may be used a monomer selected from monomers of an acrylic ester and methacrylic ester. In particular, there is preferably used an ester of acrylic acid or methacrylic acid with a substituted aliphatic alcohol (having a substituent such as an epoxy group) or an unsubstituted aliphatic alcohol having 1 to 20 carbon atoms, particularly 1 to 18 carbon atoms.

Specific examples of the acrylic monomers may include alkyl acrylate in which the alkyl group has 1 to 20 carbon atoms, preferably 1 to 18 carbon atoms (including methyl acrylate, ethyl acrylate, isoamyl acrylate, lauryl acrylate, and stearyl acrylate), butoxyethyl acrylate, ethoxydiethyleneglycol acrylate, methoxytriethyleneglycol acrylate, methoxypolyethyleneglycol acrylate, methoxydipropyleneglycol acrylate, phenoxyethyl acrylate, phenoxypolyethyleneglycol acrylate, tetrahydrofurfuryl acrylate, isobornyl acrylate, 1-hydroxyethyl acrylate, isooctyl acrylate, isomyristyl acrylate, isostearyl acrylate, 2-ethylhexyldiglycol acrylate, 2-hydroxybutyl acrylate, polytetramethyleneglycol diacrylate, EO(ethyleneoxide)-modified trimethylolpropane triacrylate, perfluorooctylethyl acrylate, trimethylolpropane triacrylate, EO-modified trimethylolpropane triacrylate, pentaerythritol triacrylate, pentaerythritol tetraacrylate, dipentaerythritol hexaacrylate, neopentylglycol acrylic acid/benzoic acid ester, triethyleneglycol diacrylate, polyethyleneglycol diacrylate, neopentylglycol diacrylate, 1,6-hexanediol diacrylate, 1,9-nonanediol diacrylate, dimethyloltricyclodecane diacrylate, 2-hydroxyethyl acrylate, 2-hydroxypropyl acrylate, and 2-hydroxy-3-phenoxypropyl acrylate.

Specific examples of the methacrylic monomers may include alkyl methacrylate in which the alkyl group has 1 to 20 carbon atoms, preferably 1 to 18 carbon atoms (including methyl methacrylate, ethyl methacrylate, n-butyl methacrylate, isobutyl methacrylate, 2-ethylhexyl methacrylate, isodecyl methacrylate, n-lauryl methacrylate, $C_{12}/C_{13}$-mixed alkyl methacrylate, tridecyl methacrylate, $C_{12}$ to $C_{15}$-mixed alkyl methacrylate, n-stearyl methacrylate), methoxydiethyleneglycol methacrylate, methoxypolyethyleneglycol methacrylate, cyclohexyl methacrylate, tetrahydrofurfuryl methacrylate, benzyl methacrylate, phenoxyethyl methacrylate, isobornyl methacrylate, 2-hydroxyethyl methacrylate, 2-hydroxypropyl methacrylate, 2-hydroxybutyl methacrylate, dimethylaminoethyl methacrylate, diethylaminoethyl methacrylate, glycerol dimethacrylate, ethyleneglycol dimethacrylate, diethyleneglycol dimethacrylate, 1,4-butanediol dimethacrylate, 1,6-hexanediol dimethacrylate, 1,9-nonanediol dimethacrylate, trimethylolpropane trimethacrylate, tert-butyl methacrylate, isostearyl methacrylate, methoxytriethyleneglycol methacrylate, n-butoxyethyl methacrylate, 3-chloro-2-hydroxypropyl methacrylate, triethyleneglycol dimethacrylate, polyethyleneglycol dimethacrylate, neopentylglycol dimethacrylate, trifluoroethyl methacrylate, 2,2,3,3-tetrafluoropropyl methacrylate, 2,2,3,4,4,4-hexafluorobutyl methacrylate, perfluorooctylethyl methacrylate, 1,3-butanediol dimethacrylate, 1,10-decanediol dimethacrylate, dibromoneopentylglycol dimethacrylate, and glycidyl methacrylate.

In this case, as the acrylic monomer or methacrylic monomer, which is the main component of the adhesive, there is preferably used an ester of acrylic acid or methacrylic acid with a monohydric alcohol, particularly, aliphatic monohydric alcohol. It should be noted that the aliphatic monohydric alcohol means a monohydric alcohol in which an alcoholic hydroxyl group is not connected to an aromatic ring such as a phenyl group.

On the other hand, an ester of acrylic acid or methacrylic acid with a polyhydric alcohol is preferably used for a reactive compound to be described later.

In the present invention, since most of the monomers each containing the acryloxy group or methacryloxy group are in the liquid state, it is preferable to add, for film formation, an ethylene-vinyl acetate copolymer or ethylene-ethyl acrylate copolymer in an amount of 0.5 to 80 parts, preferably 0.5 to 60 parts by weight on the basis of 100 parts by weight of the above monomer.

The polymer in the item (d) is a polymer obtained by polymerization of one or more of the above monomers in the item (c).

As the conductive particles used for the film of the present invention, various kinds of particles may be used insofar as they are preferable in electric conductivity. For example, there may be used a powder of a metal such as copper, silver or nickel, or a powder of a resin or ceramic covered with such a metal. The shape of the conductive particle is not particularly limited, and for example, it may be a flake, dendrite, granular or pellet shape.

In the present invention, the content of the conductive particles is preferably in a range of 0.1 to 15% by volume on the basis of the volume of the above material. The average particle size of the conductive particles is preferably in a range of 0.1 to 100 $\mu$m. By specifying the content and the particle size of the conductive particles, it is possible to prevent aggregation of the conductive particles between adjacent circuits, and hence to prevent short-circuit therebetween.

An organic peroxide or photosensitizer may be added for curing the anisotropic conductive film of the present invention. For the thermosetting type adhesive, an organic peroxide is generally used. For the photosetting type adhesive, a photosensitizer is generally used.

As the above organic peroxide, there may be used any type which is allowed to be decomposed at a temperature of 70° C. or more to thereby generate radicals. In particular, there is preferably used an organic peroxide in which a decomposition temperature at a half-life of 10 hours is 50° C. or more. The kind of the organic peroxide may be selected in consideration of the film formation temperature, preparation condition, curing temperature, heat resistance of a body to be bonded, and storage stability.

Specific examples of the organic peroxides may include 2,5-dimethylhexane-2,5-dihydroperoxide, 2,5-dimethyl-2,5-di(t-butylperoxy)hexyne-3, di-t-butyl peroxide, t-butylcumyl peroxide, 2,5-dimethyl-2,5-di(t-butylperoxy)hexane, dicumyl peroxide, $\alpha,\alpha'$-bis(t-butylperoxyisopropyl)benzene, n-butyl-4,4'-bis(t-butylperoxy)valerate, 1,1-bis(t-butylperoxy)cyclohexane, 1,1-bis(t-butylperoxy)-3,3,5-trimethylcyclohexane, t-butyl peroxybenzoate, benzoyl peroxide, t-butyl peroxyacetate, methylethylketone peroxide, 2,5-dimethylhexyl-2,5-bisperoxybenzoate, butyl hydroperoxide, p-menthane hydroperoxide, p-chlorobenzoyl peroxide, hydroxyheptyl peroxide, chlorohexanone peroxide, octanoyl peroxide, decanoyl peroxide, lauroyl peroxide, cumyl peroxyoctoate, succinic acid peroxide, acetyl peroxide, t-butyl peroxy(2-ethylhexanoate), m-toluoyl peroxide, t-butyl peroxyisobutylate, and 2,4-dichlorobenzoyl peroxide. At least one kind of these organic peroxides may be added singly or in combination in an amount of 0.1 to 10 parts by weight on the basis of 100 parts by weight of the above material.

As the photosensitizer (photopolymerization initiator) to be added for curing the anisotropic conductive film of the present invention, there is preferably used a radical photopolymerization initiator. Of the radical polymerization initiators, as a hydrogen abstraction initiator, there may be used benzophenone, o-benzoylmethyl benzoate, 4-benzoyl-4'-methyldiphenylsulfide, isopropyl thioxanthone, diethyl thioxanthone, or 4-(diethylamino)ethyl benzoate. Further, of the radical polymerization initiators, as an in-molecule cleaving type initiator, there may be used benzoin ether, benzoylpropyl ether, or benzyl dimethylketal; as a α-hydroxyalkylphenone, there may be used 2-hydroxy-2-methyl-1-phenylpropane-1-one, 1-hydroxycyclohexyl phenylketone, alkylphenyl glyoxylate, or diethoxyacetophenone; as a α-aminoalkylphenone type, there may be used 2-methyl-1-[4-(methylthio)phenyl]-2-morpholinopropanone-1, 2-benzyl-2-dimethylamino-1-(4-morpholinophenyl)butanone-1; and further there may be used acylphosphine oxide. At least one kind of these photosensitizers is preferably added singly or in combination in an amount of 0.1 to 10 parts by weight on the basis of 100 parts by weight of the above material.

A compound (monomer) having an acryloxy group, methacryloxy group or epoxy group is preferably added for improving or adjusting physical properties (mechanical strength, adhesive strength, optical characteristic, heat resistance, humidity resistance, weather resistance, crosslinking rate, and the like) of the anisotropic conductive film of the present invention, especially when the monomer containing an acryloxy group or methacryloxy group in the item (c) described above is not used as a main component.

As such a compound, there is generally used a derivative of acrylic acid or methacrylic acid, for example, an ester or amide thereof. The residue of the ester includes an alkyl group such as methyl, ethyl, dodecyl, stearyl, or lauryl group; cyclohexyl group, tetrahydrofurfuryl group, aminoethyl group, 2-hydroxyethyl group, 3-hydroxypropyl group or 3-chloro-2-hydroxypropyl group. Similarly, there may be used an ester with a polyfunctional alcohol such as ethyleneglycol, triethyleneglycol, polypropyleneglycol, polyethyleneglycol, trimethylolpropane, or pentaerythritol. The amide is represented by a diacetoneacrylic amide. As the polyfunctional crosslinking aid, there may be used an acrylate or methacrylate of trimethylolpropane, pentaerythritol or glycerol. As the epoxy group-containing compound, there may be used triglycidyl tris(2-hydroxyethyl) isocyanurate, neopentylglycoldiglycidyl ether, 1,6-hexanedioldiglycidyl ether, allylglycidyl ether, 2-ethylhexylglycidyl ether, phenylglycidyl ether, phenol $(EO)_5$glycidyl ether, p-t-buthylphenylglycidyl ether, glycidyl adipate, diglycidyl phthalate, glycidyl methacrylate, or butylglycidyl ether. The same effect can be formed by alloying a polymer containing an epoxy group. At least one of these compounds may be added in an amount of 0.5 to 80 parts by weight, preferably 0.5 to 70 parts by weight on the basis of 100 parts by weight of the above material. When the content is more than 80 parts by weight, workability in preparing the adhesive or film formability may be lowered.

The anisotropic conductive film of the present invention is preferably added with a silane coupling agent as an adhesion accelerator. As the silane coupling agent, there may be used at least one selected from vinyl triethoxysilane, vinyl tris(β-methoxyethoxy)silane, γ-methacryloxypropyl trimethoxysilane, vinyl triacetoxysilane, γ-glycidoxypropyl trimethoxysilane, γ-glycidoxypropyl triethoxysilane, β-(3,4-epoxycyclohexyl)ethyl trimethoxysilane, vinyl trichlorosilane, γ-mercaptopropyl trimethoxysilane, γ-aminopropyl triethoxysilane, N-β-(aminoethyl)-γ-aminopropyl trimethoxysilane, and the like. The content of the silane coupling agent is in a range of 0.01 to 5 parts by weight on the basis of 100 parts by weight of the above material.

The anisotropic conductive film of the present invention can be added with a hydrocarbon resin in the adhesive for improving the workability and sticking characteristic. The added hydrocarbon resin may be of a natural resin type or synthetic resin type. As the natural resin type, there is preferably used a rosin, a derivative of the rosin, or a terpene resin. Specific examples of the rosins may include a gum based resin, tall oil based resin, and wood based resin. As the derivative of a rosin, there may be used a derivative obtained by hydrogenation, disproportionation, polymerization, esterification, or conversion into a metal-salt of the rosin. As the terpene resin, there may be used α-pinene or β-pinene, or a terpene phenol resin. Further, there may be used dammar, copal, or shellac as the other natural resin. As the synthetic resin type, there is preferably used a petroleum based resin, phenol based resin, or xylene based resin. Specific examples of the petroleum based resins may include an aliphatic petroleum resin, aromatic petroleum resin, alicyclic petroleum resin, copolymer type petroleum resin, hydrogenated petroleum resin, pure monomer type petroleum resin, and cumarone-indene resin. Specific examples of the phenol based resins may include an alkylphenol resin, and modified phenol resin. Specific examples of the xylene based resins may include a xylene resin and modified xylene resin.

The added amount of the hydrocarbon resin is, while not exclusively, preferably in a range of 1 to 200 parts, more preferably 5 to 150 parts by weight on the basis of 100 parts by weight of the above material.

In addition to the above-described additives, there may be added an ageing preventive agent, ultraviolet absorbent, dye, processing aid and the like within such a range as not to exert adverse effect on the anisotropic conductive film of the present invention.

To obtain the anisotropic conductive film of the present invention, the above material as the main component is added with a crosslinking agent for generating radicals by heat or light (organic peroxide and/or photosensitizer) and, if needed, a crosslinking aid, silane coupling agent, acryloxy group-containing compound, methacryloxy group-containing compound, epoxy group-containing compound, and hydrocarbon resin, and further conductive particles.

The anisotropic conductive film of the present invention can be formed into a desired shape by a manner of uniformly mixing the above material with the above additives and conductive particles, kneading the mixture using an extruder or rolls, and forming the kneaded mixture into a film by a calendar roll, T-die extrusion, or inflation process. The film may be subjected to embossing for preventing blocking and making easy press-contact with a body to be coated. The film thus formed is laminated on a body to be coated (polyimide, copper foil, or the like) by a laminating process using a thermal press, by a directly laminating process using an extruder or calendar, or by a heating/pressurizing process using a film laminator.

Alternatively, there may be adopted a method of uniformly dissolving the above components in a solvent not exerting any effect on a member (separator), coating the surface of the separator with the solution thus obtained, temporarily bringing the other body to be coated (polyimide, copper foil or the like) in press-contact with the separator, and forming a film on the body to be coated by thermosetting or photosetting.

The curing condition of the anisotropic conductive film of the present invention is, if the adhesive is of the thermosetting type, dependent on the kind of the organic peroxide used. In general, the curing temperature is set in a range of 70 to 170 ° C., preferably 70 to 150° C., generally for 10 seconds to 120 minutes, preferably for 20 seconds to 60 minutes.

In the case of photosetting type using a photo-sensitizer, various light sources capable of emitting light in a region of ultraviolet light to visual light may be used, for example, ultra-high pressure, high pressure and low pressure mercury lamps, chemical lamp, xenon lamp, halogen lamp, mercury/halogen lamp, carbon arc lamp, incandescent lamp, and laser. The irradiation time, while being dependent on the kind of the lamp and intensity of the light source, may be set at a value of several ten seconds to several ten minutes. To promote curing, a laminated body may be previously heated at a temperature of 40 to 120° C. before irradiation of ultraviolet rays.

In this case, while a conductivity is generated in the pressurizing direction (thickness direction of the film) by a pressure applied upon adhesive bonding, such pressure may be suitably selected, for example, in a range of 5 to 50 kg/cm$^2$, preferably 10 to 30 kg/cm$^2$.

The anisotropic conductive film of the present invention preferably exhibits a conductivity of 10Ω or less, particularly, 5Ω or less in the thickness direction of the film, and a resistance in the face direction in a range of $10^6$Ω or more, particularly, $10^9$Ω or more.

The anisotropic conductive film of the present invention can be used for the same applications as those for the conventional one, for example, for connection between various terminals such as connection of a FPC or TAB with ITO terminals on a glass substrate of a liquid crystal panel. In the film of the present invention, upon curing, a crosslinking structure is formed and at the same time a high adhesive strength, particularly, a preferable adhesion with a metal, and a good durability and a high heat resistance can be obtained.

EXAMPLE

The present invention will be more clearly understood by way of, while not limited, the following examples.

Examples 1 to 6 and Comparative Example 1

In each example, a solution of a polyvinyl butyral shown in Table 1 dissolved in toluene in an amount of 25% by weight was prepared, and was mixed with components shown in Table 1 in respective amounts shown in Table 1 (parts by weight on the basis of 100 parts by weight of the polyvinyl butyral) and further mixed with conductive particles shown in Table 1 in an amount shown in Table 1 (vol %). Then, a surface of a polyethylene terephthalate as a separator was coated with the mixture thus obtained by a bar coater, to form a film having a width of 5 mm and a thickness of 15 μm.

The above sample was peeled from the separator, followed by positioning by a monitor, and was put between a flexible printed circuit and a transparent electrode glass for adhesively bonding them to each other. In this case, the sample using an organic peroxide was heated and pressurized at 160° C. for 30 seconds, and the sample using the photosensitizer was irradiated with light from a halogen lamp for 30 seconds. Then, a conductive resistance and a lateral insulating resistance between the flexible printed board and the transparent electrode glass with the sample put therebetween were measured. The results are shown in Table 1.

TABLE 1

|  | Thermosetting Type Example |  |  |  | Photosetting Type |  | Comparative Example |
|---|---|---|---|---|---|---|---|
|  | 1 | 2 | 3 | 4 | 5 | 6 | 1 |
| main component |  |  |  |  |  |  |  |
| kind | #6000-C | #6000-C | #3000-I | #3000-I | #6000-C | #3000-I | epoxy based thermosetting resin |
| preparation | dissolution of 25 wt % of resin in hot toluene |  |  |  |  |  |  |
| organic peroxide |  |  |  |  |  |  |  |
| kind | benzoyl peroxide | benzoyl peroxide | benzoyl peroxide | benzoyl peroxide |  |  |  |
| content* | 2.0 | 2.0 | 2.0 | 2.0 |  |  |  |
| photosensitizer |  |  |  |  |  |  |  |
| kind |  |  |  |  | benzoyl propyl ether | benzoyl propyl ether |  |
| content* |  |  |  |  | 2.0 | 2.0 |  |
| silane coupling agent |  |  |  |  |  |  |  |
| kind | γ-methacryloxypropyl trimethoxysilane |  |  |  |  |  |  |
| content* | 0.5 | 0.5 | 0.5 | 0.5 | 0.5 | 0.5 |  |
| acryloxy group-containing compound |  |  |  |  |  |  |  |
| kind | PETA |  |  |  | PEGDA | PETA |  |
| content* | 15 |  |  |  | 10 | 15 |  |
| methacryloxy group-containing compound |  |  |  |  |  |  |  |
| kind |  | NPGDMA |  |  |  | NPGDMA |  |
| content* |  | 10 |  |  |  | 10 |  |
| epoxy group- |  |  |  |  |  |  |  |

TABLE 1-continued

| | Thermosetting Type Example | | | | | Photosetting Type | Comparative Example |
|---|---|---|---|---|---|---|---|
| | 1 | 2 | 3 | 4 | 5 | 6 | 1 |
| containing compound | | | | | | | |
| kind | | | GMA | GMA | | | |
| content* | | | 10 | 5 | | | |
| hydrocarbon resin | | | | | | | |
| kind | | | | p-70 | | p-70 | |
| content* | | | | 3 | | 3 | |
| conductive particles | | | | | | | |
| kind | | | | particles of nickel* | | | |
| particle size | 10.0 | 10.0 | 10.0 | 10.0 | 10.0 | 10.0 | |
| content (vol %) | 4.0 | 4.0 | 4.0 | 4.0 | 4.0 | 4.0 | |
| characteristics directly after bonding | | | | | | | |
| conductive resistance | 0.3 Ω or less | 0.3 Ω or less | 0.3 Ω or less | 0.3 Ω or less | 0.3 Ω or less | 0.3 Ω or less | 0.5 Ω or less |
| insulating resistance | $10^{14}$ Ω or more | $10^{14}$ Ω or more | $10^{14}$ Ω or more | $10^{14}$ Ω or more | $10^{14}$ Ω or more | $10^{14}$ Ω or more | $10^9$ Ω or more |
| adhesive strength (kg/inch) | 2.2 | 2.1 | 1.8 | 1.9 | 1.6 | 1.7 | 0.2 |
| characteristics after 600 hr under 85° C. × 85% (humidity) | | | | | | | |
| conductive resistance | 0.5 Ω or less | 0.5 Ω or less | 0.5 Ω or less | 0.5 Ω or less | 0.5 Ω or less | 0.5 Ω or less | 320 Ω or less |
| insulating resistance | $10^{12}$ Ω or more | $10^{12}$ Ω or more | $10^{12}$ Ω or more | $10^{12}$ Ω or more | $10^{12}$ Ω or more | $10^{12}$ Ω or more | $10^9$ Ω or more |
| adhesive strength (kg/inch) | 2.0 | 1.9 | 1.8 | 1.8 | 1.6 | 1.6 | 0.1 |

Note:
1) The content* is expressed in parts by weight
2) #6000-C and #3000-I: butyral #6000-C and butyral #3000-I produced by Denki Kagaku Kogyo Kabushiki Kaisha
p-70: Alcon p-70 produced by ARAKAWA CHEMICAL INDUSTRIES, LTD.
PETA: pentaerythritol tetraacrylate
PEGDA: polyethyleneglycol diacrylate
NPGDMA: neopentylglycol dimethacrylate
GMA: glycidyl methacrylate
3) particles of nickel*: produced by FUKUDA METAL FOIL & POWDER CO., LTD.

Examples 7 to 12

In each example, a solution of an oligomer of a diallyl phthalate shown in Table 2 dissolved in toluene in an amount of 40% by weight was prepared, and was mixed with components shown in Table 2 in respective amounts shown in Table 2 (parts by weight on the basis of 100 parts by weight of the oligomer) and further provided with conductive particles shown in Table 2 in an amount shown in Table 2 (vol %). Then, a surface of a polyethylene terephthalate as a separator was coated with the mixture thus obtained by a bar coater, to form a film having a width of 5 mm and a thickness of 15 μm.

For the above sample, a conductive resistance and a lateral insulating resistance between the flexible printed board and the transparent electrode glass with the sample put therebetween were measured in the same manner as that in the previous examples. The results are shown in Table 2.

TABLE 2

| | Thermosetting Type Example | | | | Photosetting Type | |
|---|---|---|---|---|---|---|
| | 7 | 8 | 9 | 10 | 11 | 12 |
| main component | | | | | | |
| kind | DAP A | DAP K | ISODAP IK | DAP K | DAP A | DAP K |
| preparation | | | dissolution of 40 wt % of resin in hot toluene | | | |
| organic peroxide | | | | | | |
| kind | | benzoyl peroxide | benzoyl peroxide | benzoyl peroxide | benzoyl peroxide | | |

TABLE 2-continued

| | Thermosetting Type Example | | | | Photosetting Type | |
|---|---|---|---|---|---|---|
| | 7 | 8 | 9 | 10 | 11 | 12 |
| content* | 2.0 | 2.0 | 2.0 | 2.0 | | |
| photosensitizer | | | | | | |
| kind | | | | | benzoyl propyl ether | benzoyl propyl ether |
| content* | | | | | 2.0 | 2.0 |
| silane coupling agent | | | | | | |
| kind | γ-methacryloxypropyl trimethoxysilane | | | | | |
| content* | 0.5 | 0.5 | 0.5 | 0.5 | 0.5 | 0.5 |
| acryloxy group-containing compound | | | | | | |
| kind | pentaerythritol tetraacrylate | | | | | |
| content* | 10 | 3 | 3 | 3 | 5 | 5 |
| methacryloxy group-containing compound | | | | | | |
| kind | | | NPGDMA | NPGDMA | NPGDMA | NPGDMA |
| content* | | | 5 | 5 | 5 | 5 |
| epoxy group-containing compound | | | | | | |
| kind | | GMA | | | | |
| content* | | 5 | | | | |
| hydrocarbon resin | | | | | | |
| kind | | | | p-70 | | p-70 |
| content* | | | | 3 | | 3 |
| conductive particles | | | | | | |
| kind | particles of nickel* | | | | | |
| particle size | 10.0 | 10.0 | 10.0 | 10.0 | 10.0 | 10.0 |
| content (vol %) | 4.0 | 4.0 | 4.0 | 4.0 | 4.0 | 4.0 |
| characteristics directly after bonding | | | | | | |
| conductive resistance | 0.3 Ω or less | 0.3 Ω or less | 0.3 Ω or less | 0.3 Ω or less | 0.3 Ω or less | 0.3 Ω or less |
| insulating resistance | $10^{14}$ Ω or more | $10^{14}$ Ω or more | $10^{14}$ Ω or more | $10^{14}$ Ω or more | $10^{14}$ Ω or more | $10^{14}$ Ω or more |
| adhesive strength (kg/inch) | 1.6 | 1.7 | 1.5 | 1.8 | 1.6 | 2.0 |
| characteristics after 600 hr under 85° C. × 85% (humidity) | | | | | | |
| conductive resistance | 0.5 Ω or less | 0.5 Ω or less | 0.5 Ω or less | 0.5 Ω or less | 0.5 Ω or less | 0.5 Ω or less |
| insulating resistance | $10^{13}$ Ω or more | $10^{13}$ Ω or more | $10^{13}$ Ω or more | $10^{13}$ Ω or more | $10^{13}$ Ω or more | $10^{13}$ Ω or more |
| adhesive strength (kg/inch) | 1.6 | 1.7 | 1.5 | 1.7 | 1.5 | 1.9 |

Note:
1) The content* is expressed in parts by weight
2) DAP A, ISODAP IK and DAP K: produced by DAISO CO., LTD.
p-70: Alcon p-70 produced by ARAKAWA CHEMICAL INDUSTRIES, LTD.
NPGDMA: neopentylglycol dimethacrylate
GMA: glycidyl methacrylate
3) particles of nickel*: produced by FUKUDA METAL FOIL & POWDER CO., LTD.

Examples 13 to 18

In each example, a solution of a methacrylate monomer shown in Table 3 dissolved in toluene in an amount of 30% by weight was prepared, and was mixed with components shown in Table 3 in respective amounts shown in Table 3 (parts by weight on the basis of 100 parts by weight of the monomer) and further provided with conductive particles shown in Table 3 in an amount shown in Table 3 (vol %). Then, a surface of a polyethylene terephthalate as a separator was coated with the mixture thus obtained by a bar coater, to form a film having a width of 5 mm and a thickness of 15 μm.

For the above sample, a conductive resistance and a lateral insulating resistance between the flexible printed board and the transparent electrode glass with the sample put therebetween were measured in the same manner as that in the previous examples. The results are shown in Table 3.

TABLE 3

|  | Thermoseeing Type Example | | | | Photosetting Type | |
| --- | --- | --- | --- | --- | --- | --- |
|  | 13 | 14 | 15 | 16 | 17 | 18 |
| main component | | | | | | |
| kind | MMA | MMA | 50/50 mixture of MMA/ SLMA | 50/50 mixture of MMA/ SLMA | 80/20 mixture of MMA/ HEMA | 80/20 mixture of MMA/ HEMA |
| preparation | dissolution of 30 wt % of resin in hot toluene | | | | | |
| added resin | | | | | | |
| kind | UE760R | | | | | |
| content* | 30 | 30 | 30 | 30 | 30 | 30 |
| organic peroxide | | | | | | |
| kind | benzoyl peroxide | benzoyl peroxide | benzoyl peroxide | benzoyl peroxide | | |
| content* | 4.0 | 4.0 | 4.0 | 4.0 | | |
| photosensitizer | | | | | | |
| kind | | | | | benzoyl propyl ether | benzoyl propyl ether |
| content* | | | | | 4.0 | 4.0 |
| silane coupling agent | | | | | | |
| kind | γ-methacryloxypropyl trimethoxysilane | | | | | |
| content* | 0.5 | 0.5 | 0.5 | 0.5 | 0.5 | 0.5 |
| acryloxy group- containing compound | | | | | | |
| kind | PETA | PETA | NPGDA | NPGDA | PETA | PETA |
| content* | 1 | 1 | 5 | 5 | 1 | 1 |
| methacryloxy group- containing compound | | | | | | |
| kind | | | PEGDMA | | | |
| content* | | | 5 | | | |
| epoxy group- containing compound | | | | | | |
| kind | | GMA | | GMA | | |
| content* | | 4 | | 5 | | |
| hydrocarbon resin | | | | | | |
| kind | | | | p-70 | | p-70 |
| content* | | | | 3 | | 3 |
| conductive particles | | | | | | |
| kind | particles of nickel* | | | | | |
| particle size | 10.0 | 10.0 | 10.0 | 10.0 | 10.0 | 10.0 |
| content (vol %) | 4.0 | 4.0 | 4.0 | 4.0 | 4.0 | 4.0 |
| characteristics directly after bonding | | | | | | |
| conductive resistance | 0.3 Ω or less | 0.3 Ω or less | 0.3 Ω or less | 0.3 Ω or less | 0.3 Ω or less | 0.3 Ω or less |
| insulating resistance | $10^{14}$ Ω or more | $10^{14}$ Ω or more | $10^{14}$ Ω or more | $10^{14}$ Ω or more | $10^{14}$ Ω or more | $10^{14}$ Ω or more |
| adhesive strength (kg/inch) | 3.5 | 3.6 | 3.1 | 3.4 | 2.1 | 2.4 |
| characteristics after 600 hr under 85° C. × 85% (humidity) | | | | | | |
| conductive resistance | 0.5 Ω or less | 0.5 Ω or less | 0.5 Ω or less | 0.5 Ω or less | 0.5 Ω or less | 0.5 Ω or less |
| insulating resistance | $10^{13}$ Ω or more | $10^{13}$ Ω or more | $10^{13}$ Ω or more | $10^{13}$ Ω or more | $10^{13}$ Ω or more | $10^{13}$ Ω or more |

TABLE 3-continued

|  | Thermoseeing Type Example | | | | Photosetting Type | |
|---|---|---|---|---|---|---|
|  | 13 | 14 | 15 | 16 | 17 | 18 |
| adhesive strength (kg/inch) | 3.3 | 3.4 | 3.0 | 3.3 | 1.9 | 2.2 |

Note:
1) The content* is expressed in parts by weight
2) UE760R: EVA produced by TOSHO CORPORATION, UNTRASEN UE760R
p-70: Alcon p-70 produced by ARAKAWA CHEMICAL INDUSTRIES, LTD.
MMA: methyl methacrylate
SLMA: stearyl methacrylate
HEMA: hydroxyethyl methacrylate
PETA: pentaerythritol tetraacrylate
NPGDA: neopentylglycol diacrylate
PEGDMA: polyethyleneglycol dimethacrylate
GMA: glycidyl methacrylate
3) particles of nickel*: produced by FUKUDA METAL FOIL & POWDER CO., LTD.

Examples 19 to 24

In each example, a solution of a methacrylic monomer shown in Table 4 dissolved in toluene in an amount of 30% by weight was prepared, and was mixed with components shown in Table 4 in respective amounts shown in Table 4 (parts by weight on the basis of 100 parts by weight of the monomer) and further provided with conductive particles shown in Table 4 in an amount shown in Table 4 (vol %). Then, a surface of a polyethylene terephthalate as a separator was coated with the mixture thus obtained by a bar coater, to form a film having a width of 5 mm and a thickness of 15 μm.

For the above sample, a conductive resistance and a lateral insulating resistance between the flexible printed board and the transparent electrode glass with the sample put therebetween were measured in the same manner as that in the previous examples. The results are shown in Table 4.

TABLE 4

|  | Thermosetting Type Example | | | | Photosetting Type | |
|---|---|---|---|---|---|---|
|  | 19 | 20 | 21 | 22 | 23 | 24 |
| main component |  |  |  |  |  |  |
| kind | copolymer (30000) of 60/40 of MMA/ SLMA | copolymer (30000) of 60/40 of MMA/ SLMA | copolymer (10000) of 50/50 of BMA/ HEMA | copolymer (10000) of 50/50 of HMA/ HEMA | copolymer (30000) of 60/40 of MMA SLMA | copolymer (30000) of 60/40 of MMA/ SLMA |
| preparation | dissolution of 30 wt % of resin in hot toluene | | | | | |
| organic peroxide |  |  |  |  |  |  |
| kind | benzoyl peroxide | benzoyl peroxide | benzoyl peroxide | benzoyl peroxide |  |  |
| content* | 4.0 | 4.0 | 4.0 | 4.0 |  |  |
| photosensitizer |  |  |  |  |  |  |
| kind |  |  |  |  | benzoyl propyl ether | benzoyl propyl ether |
| content* |  |  |  |  | 4.0 | 4.0 |
| silane coupling agent |  |  |  |  |  |  |
| kind | γ-methacryloxypropyl trimethoxysilane | | | | | |
| content* | 0.5 | 0.5 | 0.5 | 0.5 | 0.5 | 0.5 |
| acryloxy group- containing compound |  |  |  |  |  |  |
| kind | PETA | PETA | NPGDA | NPGDA | PETA | PETA |
| content* | 5 | 5 | 10 | 10 | 5 | 5 |
| methacryloxy group- containing compound |  |  |  |  |  |  |
| kind |  |  | PEGDMA | PEGDMA | PEGDMA | PEGDMA |
| content* |  |  | 5 | 5 | 5 | 5 |

TABLE 4-continued

|  | Thermosetting Type Example | | | | Photosetting Type | |
| --- | --- | --- | --- | --- | --- | --- |
|  | 19 | 20 | 21 | 22 | 23 | 24 |
| epoxy group-containing compound | | | | | | |
| kind | | GMA | | GMA | | |
| content* | | 5 | | 5 | | |
| hydrocarbon resin | | | | | | |
| kind | | | | p-70 | | p-70 |
| content* | | | | 3 | | 3 |
| conductive particles | | | | | | |
| kind | | | particles of nickel* | | | |
| particle size | 10.0 | 10.0 | 10.0 | 10.0 | 10.0 | 10.0 |
| content (vol %) | 4.0 | 4.0 | 4.0 | 4.0 | 4.0 | 4.0 |
| characteristics directly after bonding | | | | | | |
| conductive resistance | 0.5 Ω or less | 0.5 Ω or less | 0.5 Ω or less | 0.5 Ω or less | 0.5 Ω or less | 0.5 Ω or less |
| insulating resistance | $10^{14}$ Ω or more | $10^{14}$ Ω or more | $10^{14}$ Ω or more | $10^{14}$ Ω or more | $10^{14}$ Ω or more | $10^{14}$ Ω or more |
| adhesive strength (kg/inch) | 3.0 | 3.2 | 2.6 | 3.5 | 1.6 | 2.0 |
| characteristics after 600 hr under 85° C. × 85% (humidity) | | | | | | |
| conductive resistance | 0.6 Ω or less | 0.6 Ω or less | 0.6 Ω or less | 0.6 Ω or less | 0.6 Ω or less | 0.6 Ω or less |
| insulating resistance | $10^{13}$ Ω or more | $10^{13}$ Ω or more | $10^{13}$ Ω or more | $10^{13}$ Ω or more | $10^{13}$ Ω or more | $10^{13}$ Ω or more |
| adhesive strength (kg/inch) | 3.0 | 3.1 | 2.5 | 3.4 | 1.6 | 2.0 |

Note:
1) The content* is expressed in parts by weight
2) p-70: Alcon p-70 produced by ARAKAWA CHEMICAL INDUSTRIES, LTD.
MMA: methyl methacrylate
SLMA: stearyl methacrylate
BMA: butyl methacrylate
HMA: hydroxy methacrylate
HEMA: hydroxyethyl methacrylate
PETA: pentaerythritol tetraacrylate
NPGDA: neopentylglycol diacrylate
PEGDMA: polyethyleneglycol dimethacrylate
GMA: glycidyl methacrylate
3) particles of nickel*: produced by FUKUDA METAL FOIL & POWDER CO., LTD.

As described above, the anisotropic conductive film of the present invention is high in adhesive strength, good in workability, and high in humidity/heat resistance, and further it is good in durability, that is, it keeps a conductivity in the thickness direction and an insulation in the face direction even after being held under a high humidity/high temperature environment for a long period of time.

What is claimed is:

1. An anisotropic conductive film which exhibits a conductivity of 10Ω or less in the thickness direction thereof and a resistance of $10^6$Ω or more in the face direction thereof when said film is pressurized in the thickness direction, said film comprising an adhesive and conductive particles dispersed in said adhesive, wherein said adhesive is a thermosetting or photosetting adhesive comprising:

as a main component at least one member selected from a group consisting of
(a) a polymer obtained by acetalation of a polyvinyl alcohol,
(b) a compound containing an allyl group which is selected from the group consisting of a monomer of triallyl cyanurate, a monomer of tryallyl isocyanurate, a monomer of diallyl phthalate, a monomer of diallyl isophthalate, and a monomer of diallyl maleate; and a polymer obtained by polymerization of one or more of the monomer,
(c) a monomer containing an acryloxy group or methacryloxy group, and
(d) a polymer obtained by polymerization of at least one monomer selected from a group consisting of an acrylic monomer and a methacrylic monomer;

a peroxide or photosensitizer; and a silane coupling agent, and wherein said conductive particles are a powder of a metal or a powder of a resin or ceramic covered with a metal and the content of said conductive particles is in a range of 0.1 to 15% by volume on the basis of the volume of main component.

2. An anisotropic conductive film according to claim 1, wherein said main component comprises the polymer (a) and said polymer (a) contains an acetal group in an amount of 30 mol % or more.

3. An anisotropic conductive film according to claim 1, wherein said main component comprises the allyl group-containing compound (b) and said allyl group-containing compound (b) is a polymer obtained by the polymerization of one or more monomers each containing an allyl group.

4. An anisotropic conductive film according to claim 1, wherein said adhesive is added with a peroxide or photosensitizer in an amount of 0.1 to 10 parts by weight on the basis of 100 parts by weight of main component.

5. An anisotropic conductive film according to claim 1, wherein said adhesive further comprises at least one monomer selected from a group consisting of an acryloxy group-containing monomer, a methacryloxy group-containing monomer, and an epoxy group-containing monomer in an amount of 0.5 to 80 parts by weight on the basis of 100 parts by weight of said main component.

6. An anisotropic conductive film according to claim 1, wherein said adhesive is added with a silane coupling agent in an amount of 0.01 to 5 parts by weight on the basis of 100 parts by weight of main component.

7. An anisotropic conductive film according to claim 1, wherein said adhesive is added with a hydrocarbon resin in an amount of 1 to 200 parts by weight on the basis of 100 parts by weight of main component.

8. An anisotropic conductive film according to claim 1, wherein an average particle size of said conductive particles is in a range of 0.1 to 100 $\mu$m.

\* \* \* \* \*